United States Patent
Sebastien et al.

(10) Patent No.: US 9,288,912 B2
(45) Date of Patent: Mar. 15, 2016

(54) DEPOSITION BY SPIN COATING OF A PATTERNED THIN LAYER ON A SUBSTRATE

(71) Applicant: COMMISSARIAT À L'ENERGIE ATOMIQUE ET AUX ENERGIES ALTERNATIVES, Paris (FR)

(72) Inventors: Thomas Sebastien, Saint-Martin-le-Vinoux (FR); Messaoud Bedjaoui, Voreppe (FR); Aboubakr Ennajdaoui, Saint Martin le Vinoux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/445,909

(22) Filed: Jul. 29, 2014

(65) Prior Publication Data

US 2015/0027769 A1 Jan. 29, 2015

(30) Foreign Application Priority Data

Jul. 29, 2013 (FR) .................................... 13 01818

(51) Int. Cl.
| | |
|---|---|
| *H05K 1/11* | (2006.01) |
| *H05K 3/06* | (2006.01) |
| *B05D 1/00* | (2006.01) |
| *B05D 1/32* | (2006.01) |
| *B05D 3/10* | (2006.01) |
| *B81B 7/00* | (2006.01) |

(52) U.S. Cl.
CPC *H05K 3/06* (2013.01); *B05D 1/005* (2013.01); *B05D 1/32* (2013.01); *B05D 3/107* (2013.01); *B81B 7/007* (2013.01); *H05K 1/111* (2013.01)

(58) Field of Classification Search
CPC ....... H01L 21/70; H01L 21/43; H01L 21/768; B32B 3/10; C09K 3/14
USPC ........... 174/262, 255; 428/141; 438/690, 693; 156/299
See application file for complete search history.

(56) References Cited

U.S. PATENT DOCUMENTS

| | | | | |
|---|---|---|---|---|
| 2004/0235406 | A1* | 11/2004 | Duescher | B24D 11/001 451/527 |
| 2004/0253822 | A1* | 12/2004 | Matsui | C09G 1/02 438/690 |
| 2009/0068841 | A1* | 3/2009 | Matsui | C09G 1/02 438/693 |
| 2010/0136288 | A1* | 6/2010 | Tanaka | H01J 11/44 428/141 |
| 2010/0183866 | A1 | 7/2010 | Fujimoto et al. | |
| 2011/0173873 | A1* | 7/2011 | Nakanishi | A01K 91/00 43/44.98 |
| 2013/0037929 | A1 | 2/2013 | Essig et al. | |

FOREIGN PATENT DOCUMENTS

JP    A-2007-298971    11/2007

* cited by examiner

Primary Examiner — Xiaoliang Chen
(74) Attorney, Agent, or Firm — Oliff PLC (57) ABSTRACT

The method for producing a patterned layer of first material on a surface of a substrate comprises the following successive steps:
   arranging a particle on the surface of the substrate;
   depositing a resin by spin coating on the surface of the substrate so as to form the patterned layer of first material and a hole passing through the layer of first material and opening onto the particle;
the material of the particle and the resin being chosen such that the particle exerts a repulsive interaction with respect to the resin.

8 Claims, 5 Drawing Sheets

DEPOSITION BY SPIN COATING OF A PATTERNED THIN LAYER ON A SUBSTRATE

BACKGROUND OF THE INVENTION

The invention relates to a method for producing a patterned layer by means of spin coating deposition.

STATE OF THE ART

In the field of micro and nanotechnologies, the methods for producing patterned layers with predefined geometric shapes are constantly changing. Patterning of thin layers does in fact open up a wide range of interesting applications, in particular for producing nanometric or micrometric structures designed to form microelectronic, optic, or biotechnological devices.

Furthermore, resin-based layers are used in most of the methods for producing micro and/or nanometric devices. Deposition of thin layers of resin on a substrate is in general manner performed by spin coating. This technique enables deposition of a homogeneous layer with precise control of its thickness.

The variety of the composition of the different types of resin and of their mechanical, chemical, thermal and optic properties enables them to be used for a large number of applications. According to the application involved, the resin layers can for example perform functions of encapsulation, electric or thermal insulation, passivation, planarization, etc.

In certain uses, a thin layer of resin is patterned on a micrometric and/or nanometric scale. This patterning can be performed by means of several techniques.

For example purposes, patterning by laser is a laser ablation technique which enables patterns to be generated at the surface or in the volume in a layer of resin. The geometric characteristics of the resulting pattern which is formed in the resin layer vary according to the power, the diameter and the wavelength of the beam and also to the exposure time.

A resin-based thin layer can also be patterned by a technique making use of a patterned pad, such as patterning by printing, moulding or stamping (commonly called soft lithography techniques).

Photolithography techniques can further be used to pattern a thin layer of resin. These are conventional techniques used in microelectronics to pattern thin layers by forming two different materials. For example, to pattern a thin layer of polymer, a photosensitive resin (photoresist) is deposited and then exposed with an electromagnetic radiation with a particular pattern and developed. The thin layer of polymer is then etched through the pattern made in the photoresist which will be eliminated after this etching step.

The patterning techniques of thin layers of resin described above do however remain costly techniques requiring a large number of steps to be performed and/or taking a considerable time to be implemented. These techniques further use high-technology equipment requiring a specific environment and installation.

OBJECT OF THE INVENTION

The object of the invention is to provide a method for producing a patterned layer that is easy to implement and enables a homogeneity and precise control of the thickness and topography of the patterned layer.

This object tends to be achieved by providing a method for producing a patterned layer made from a first material on one surface of a substrate by arranging a particle on the surface of the substrate. Then a resin is deposited by spin coating on the surface of the substrate so as to form the patterned layer of first material and a hole passing through the layer of first material and opening onto the particle. The material of the particle and the resin are further chosen such that the particle exerts a repulsive interaction with respect to the resin.

In preferential manner, the thickness of the patterned layer is greater than the dimension of the particle along an axis substantially perpendicular to the surface of the substrate.

According to a development, the patterned layer of first material is cross-linked after the spin coating deposition step. The patterned layer of first material preferably undergoes a heat treatment step.

According to one embodiment, the method comprises elimination of the particle after formation of the patterned layer of first material.

According to another embodiment, the method comprises arrangement of at least one additional particle on the surface of the substrate so that the particle and the additional particle are located at predefined first and second positions of the surface of the substrate. The material of the additional particle is further chosen such that the additional particle exerts a repulsive interaction with respect to the resin so as to form an additional hole passing through the layer of first material and opening onto the additional particle. Advantageously, the predefined first and second positions are chosen in such a way that the pass-through hole and the additional pass-through hole overlap.

According to an additional embodiment, the pass-through hole comprises side walls and the patterned layer of first material comprises a free surface opposite the surface of the substrate. The side walls and the free surface are joined by a pad made from first material. According to this embodiment, the method comprises anisotropic etching of the first material to form a continuous closed pattern representative of the periphery of the hole.

An electronic component is also provided arranged on one surface of a substrate and comprising:
  a first electric contact pad;
  a first encapsulation layer made from electrically insulating polymer material arranged on the surface of the substrate and provided with a surface opposite this surface of the substrate, said first layer being formed so as to comprise a pass-through hole opening onto the pad;
  a second pad made from electrically conducting material, arranged on the first pad and located in the hole;
  a second electrically conducting encapsulation layer arranged on the surface, the first and second encapsulation layers forming a bilayer totally covering the component with the exception of the second pad.

The pass-through hole further comprises side walls connected to the surface by a pad of electrically insulating polymer material, the pad laterally separating the second pad and the second encapsulation layer.

BRIEF DESCRIPTION OF THE DRAWINGS

Other advantages and features will become more clearly apparent from the following description of particular embodiments of the invention given for non-restrictive example purposes only and represented in the appended drawings, in which:

FIGS. 1 to 3c illustrate, in schematic manner in cross-section, steps for producing a patterned layer on a substrate, by spin coating according to a first embodiment;

DESCRIPTION OF PREFERRED EMBODIMENTS

In the field of micro and nanotechnologies, a requirement exists to easily produce a resin-based patterned layer on a substrate, while controlling its thickness and topography with precision. This requirement tends to be met by providing a method for producing a resin-based patterned layer by spin coating.

According to a first embodiment illustrated in FIGS. 1 to 3c, the method comprises provision of a substrate 10 comprising a surface 11.

Figure 1:
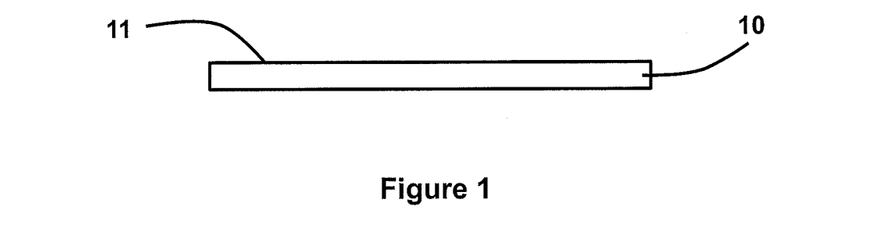
Figure 2:
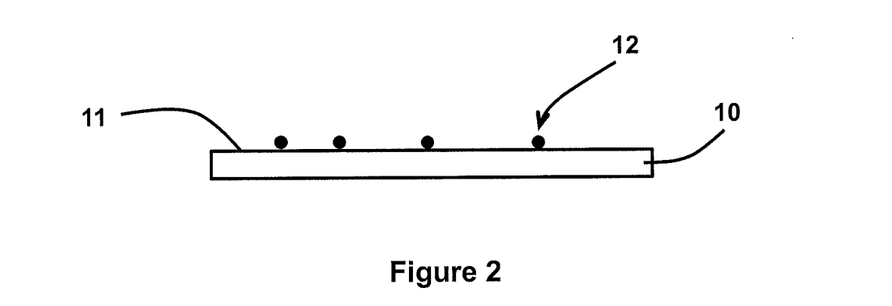

The method comprises a step of arranging a particle 12 on surface 11 of substrate 10. Deposition of a resin 13 on surface 11 of substrate 10 by spin coating is then performed. Resin 13 can also be deposited on particle 12. What is meant by resin in this description is a fluid having a base formed by a polymer material.

Resin 13 is a resin configured to be deposited by spin coating on substrate 10 to form a layer formed by this resin.

Resin 13 preferably has a low viscosity, i.e. a dynamic viscosity measured at 300 K comprised between a few tens and a few hundreds of centipoises. Furthermore, in more preferential manner, resin 13 is a viscoelastic resin. According to an example embodiment, the viscosity of an epoxy resin referenced OG146-178 and marketed by Epoxy Technology was measured by a rheometer of MCR 300 mark under the operation of Anton Paar. The viscosity was measured at 300 K, making 31 measurement points with an interval of 5 s between each two measurement points. Under these measuring conditions, a viscosity of about 165 centipoises was measured for the OG146-178 resin.

In general manner, resin 13 can be a photo or thermo-polymerizable resin used in usual manner in the microelectronics field. Furthermore, resin 13 can for example be an unsaturated-styrene polyester resin, a thiol-polyene resin, an acrylate or methacrylate resin, an epoxide resin, a vinylic or propenylic ether resin, or a hybrid system formed by a mixture of this type of resin.

Substrate 10 is a substrate compatible with the spin coating deposition method. Substrate 10 is generally a substrate used in the microelectronics field, such as a substrate made from silicon, glass, mica etc. Substrate 10 preferably comprises a surface 11 having surface properties, in particular an adherence parameter, suitable for deposition of resin 13 by spin coating to form a layer 14 of first material. What is meant by adherence parameter is a surface state favourable for spreading of the resin for formation of a homogenous and thin film. This parameter is all the higher the greater the aptitude of the resin to establish bonds of hydrogen (or Van Der Waals) type with the surface of the substrate. Surface 11 of substrate 10 can further comprises devices having micro or nanometric dimensions. In preferential manner, the surface properties of said devices are compatible with deposition of resin 13, and their dimension along an axis (Oz) substantially perpendicular to surface 11 of substrate 10 is smaller than the thickness of layer 14 of first material.

Substrate 10 is preferably cleaned before arrangement of particle 12, of micro or nanometric size. This cleaning step advantageously enables contamination of substrate 10 to be prevented.

According to an example embodiment, substrate 10 is a silicon substrate having a RMS roughness of less than 3 nm, and preferably less than or substantially equal to 1 nm. The RMS roughness (RMS standing for Root Mean Square) corresponds to the value of the root-mean-square quadratic deviation of the roughness on a scanned surface of the substrate of a few $\mu m^2$.

Furthermore, the material of particle 12 and resin 13 are chosen in such a way that particle 12 exerts a repulsive interaction with respect to resin 13 from a wettability point of view. The repulsive interaction translates the ability not to form bonds of hydrogen (or Van Der Waals) type between resin 13 and particle 12, considering that the particle is not charged on the macroscopic plane. This repulsive interaction results from the difference of surface energy between resin 13 and particle 12. The surface energy difference governs a spontaneous retraction of resin 13 when spin coating deposition is performed.

In other words, resin 13 has to be non-wetting with respect to the surface of particle 12. For example, the choice of the material of a particle and of a resin can be made according to the measurement of the contact angle which a drop of said resin forms with a flat surface of the material of said particle. In other words, the wettability of the resin with respect to said particle is evaluated by performing this conventional experiment. Thus, for a measured contact angle strictly greater than 90°, said resin and said particle material can be chosen to be used in the method.

Micropellets of silicon oxycarbide (SiOC) in powder with an epoxy resin, or micropellets of zinc oxide (ZnO) with a thermo-cross-linkable polyepoxide resin, or pellets of polystyrene with a thermosetting acrylate resin, can for example be used.

Particle 12 is preferably a particle non-soluble in resin 13. Particle 12 can further have any geometric shape and micro or nanometric dimensions. Advantageously, the thickness of patterned layer 14 is greater than the dimension of particle 12 along the axis (Oz) substantially perpendicular to surface 11 of substrate 10. In preferential manner, particle 12 has a spherical shape and a smaller diameter than the thickness of layer 14 of first material. Particle 12 preferably has a dimension of more than 10 nm.

For example, particle 12 can be a pellet formed by a metal or an oxide, such as a gold or zinc oxide pellet. Particle 12 can also be formed by an organic material, for example a pellet formed by a polymer or a cluster of bio-polymers, or micro or nanometric patterns formed by a polymer deposited on substrate 10.

Particle 12 can further be of nanometric size, for example it can be formed by aggregates of small molecules such as titanium oxide $TiO_2$ or zinc oxide ZnO, gold atoms, or large molecules such as fullerenes or dendrimers. In general manner, all the nanometric structures presenting a certain symmetry and able to cause repulsion of resin 13 can be used. The nanoparticles in advantageous manner enable the extent of the repulsive nature of particle 12 with respect to the selected resin 13 to be adjusted.

Arrangement of particle 12 on surface 11 of substrate 10 can be performed by means of several techniques, according to its shape and material. For example, several particles 12 can be dispersed in powder form on surface 11 of substrate 10, or a solvent containing particles 12 can be spread on the surface of the substrate and a drying step then be performed to evaporate the liquid phase. Surface 11 of substrate 10 can also be exposed to an inert atmosphere charged with particles 12.

According to the example embodiment, particle 12 is a ZnO pellet having a diameter substantially equal to 1 μm. Particle 12 was arranged on surface 11 of substrate 10 by spreading of an alcohol solution containing ZnO pellets. Surface 11 of substrate 10 is then dried in air to evaporate the solvent and only leave the ZnO pellets at surface 11.

Figure 3A:
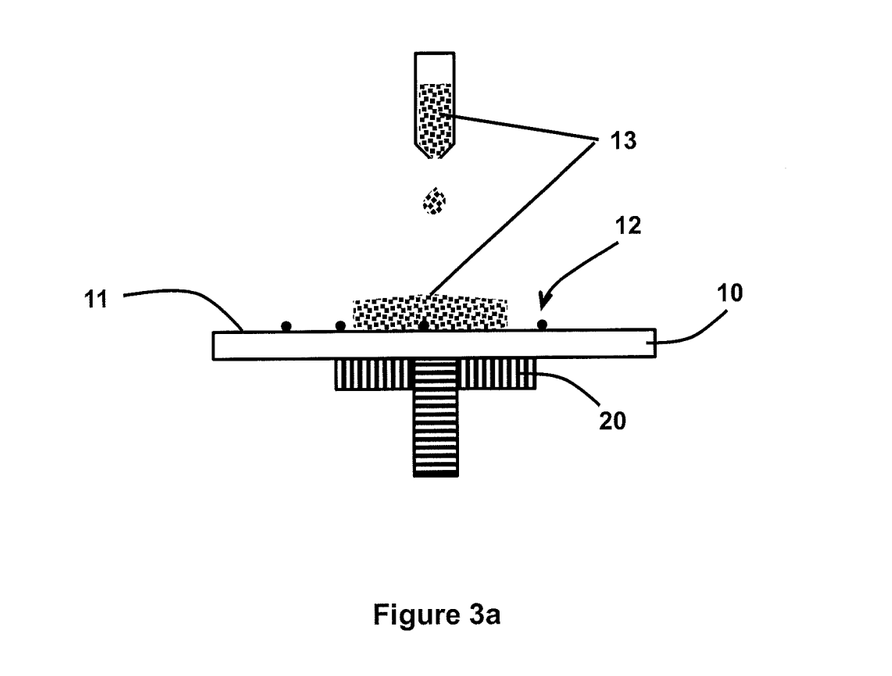
Figure 3B:
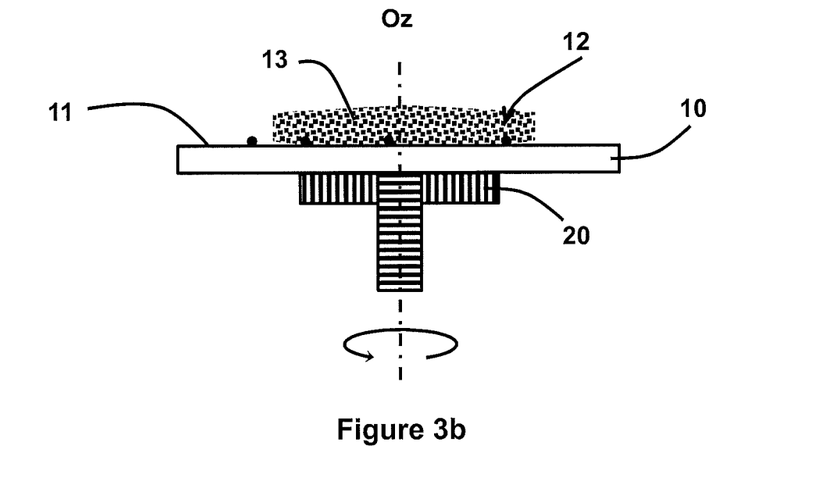
Figure 3C:
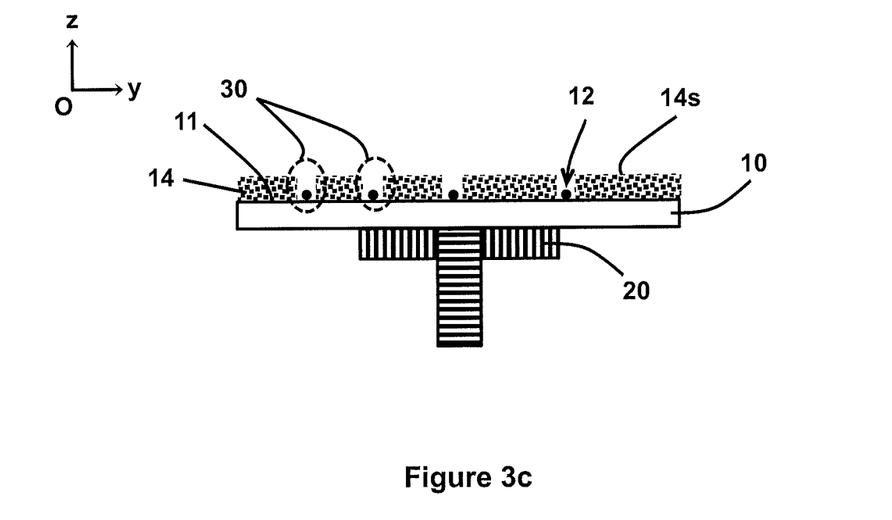

As illustrated in FIGS. 3a to 3c, when spin coating deposition is performed, substrate 10 is fixed onto a support 20. Substrate 10 is fixed onto support 20 so that surface 11 is free. Support 20 is configured so as to be able to move substrate 10 in a rotational movement around the axis (Oz) substantially perpendicular to surface 11 of substrate 10.

Substrate 10 can further be a flexible substrate fixed onto a rigid additional substrate and configured to be secured on support 20 so as to be driven in a rotational movement around the axis (Oz). What is meant by flexible substrate is a substrate having a first rigidity value that is much lower than a second rigidity value of the additional substrate. For example, substrate 10 can be a metal substrate coated with a layer of polyimide, or made from PolyEthylene Naphtalate (PEN).

Resin 13 is then deposited on surface 11 of substrate 10 (FIG. 3a). The selected resin 13 can be a photo- or thermo-cross-linkable resin able to be deposited by spin coating. The resin is for example a polyepoxide polymer, polystyrene, etc.

According to the example embodiment, resin 13 is a thermo-cross-linkable polyepoxide resin having a low viscosity of about 200 cP (centipoise) measured at 23° C. and using a centrifugation speed of about 100 rpm.

Deposition by spin coating can comprise a first rotational movement of substrate 10 around the axis (Oz) with a first angular speed. The first rotational movement can be configured so as to spread resin 13 on surface 11 so that resin 13 covers surface 11. For example, the first rotational movement can be performed to cover surface 11, and possibly in a first stage particle 12, by resin 13 by rejecting the excess resin 13 in the form of droplets (FIGS. 3b).

The first rotational movement can be followed by a second rotational movement of substrate 10 around the axis (Oz) with a second angular speed higher than the first speed.

When resin 13 comprises one or more solvents, the second rotational movement can be taken advantage of to evaporate the most volatile solvents. This evaporation can be accompanied by a reduction of the thickness of layer 14 resulting from the spin coating deposition. When the spin coating step is performed, formation of holes 30 is observed (FIG. 3c).

The spin coating deposition is preferably configured so that the thickness of patterned layer 14 is more than twice the height of particle 12. What is meant by height is the dimension along the axis (Oz) which is substantially perpendicular to the surface of substrate 10.

Spin coating deposition of resin 13 on surface 11 of substrate 10 is performed so as to form patterned layer 14 of first material and a hole 30 passing through layer 14 of first material and opening onto particle 12 (FIGS. 3a to 3c). Particle 12 does in fact give rise to dewetting of resin 13 around particle 12 when spin coating deposition is performed. Hole 30 passing through layer 14 of first material is thus formed.

Due to its repulsive nature with respect to resin 13, particle 12 advantageously enables resin 13 to be dewetted thereby creating hole 30 in layer 14. Particle 12 further enables breaking of the flatness of surface 11 of substrate 10, which enhances triggering of the dewetting phenomenon. However, it is the repulsive nature of particle 12 with respect to resin 13 which enables hole 30 to be formed and its dimensions to be controlled.

Advantageously, fabrication of layer 14 of first material on substrate 10 enables deposition and patterning (production of holes) of layer 14 to be combined, on a micro and/or nanometric scale, during spin coating deposition. This deposition thereby advantageously enables precise control of the thickness of layer 14 of the first material and of the dimensions of hole 30 formed.

Furthermore, formation of patterned layer 14 does not generates either re-deposition of materials or localised heating, or degassing, unlike traditional chemical, physical or laser etching methods. The method for producing the patterned layer of first material is furthermore easy to implement, inexpensive, and requires few steps and little equipment.

According to the example embodiment, the conditions of the spin coating deposition of polyepoxide resin 13 were configured so as to form a layer 14 with a thickness of 5 μm on silicon substrate 10. Spin coating deposition was performed in three phases:
 a first acceleration phase at 1000 rpm/s to reach the first speed of a value of 1200 rpm kept for 130 s;
 a second acceleration phase at 4000 rpm/s to reach the second speed of a value of about 2400 rpm kept for 20 s; and
 a sharp deceleration phase to stop rotation of substrate 10.

A homogenous and levelled spreading of polyepoxide resin 13 is thereby obtained. Deposition further gives rise to dewetting of resin 13 around the ZnO particles 12 arranged on surface 11 of silicon substrate 10 thus forming holes 30.

Layer 14 obtained is then advantageously exposed to a wavelength of about 300 nm and a power of 100 mW/cm² for 5 minutes to cross-link polymer layer 14. To improve the structural and mechanical properties of layer 14 comprising holes 30, layer 14 preferably underwent heat treatment at 75° C. for 15 minutes.

In this example embodiment, holes 30 formed in polymer layer 14 formed by polyepoxide open onto portions of surface 11 of substrate 10, each comprising a particle 12 of ZnO. The holes thus measure about 5 μm in height and about 10 μm in width. Side walls 30l of holes 30 are slightly inclined with respect to front surface 11. Holes 30 further comprise pads 40 measuring about 1 μm in height.

In preferential manner, several particles substantially identical to particle 12 are arranged on surface 11 so as to form several holes substantially identical to hole 30 in first material layer 14. Formation of several holes randomly distributed in a thin layer can be advantageously used to form a porous layer, an alveolated structure, or a membrane only letting certain sizes of molecules pass.

Figure 4:
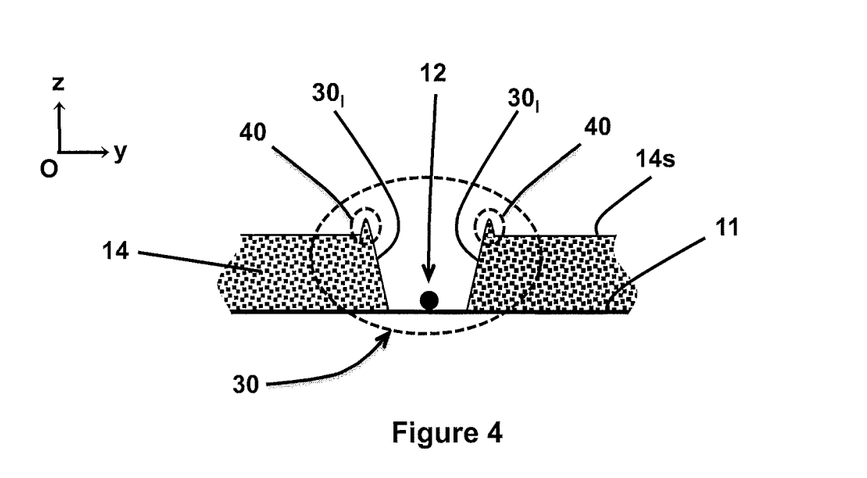
FIG. 4 illustrates, in schematic manner in cross section, an enlargement of a hole formed in the patterned layer of FIG. 3c.

As illustrated in FIGS. 3c and 4, the step of spin coating deposition of resin 13 enables hole 30 to be formed in layer 14. Layer 14 comprises a free surface 14s opposite surface 11 of substrate 10, and hole 30 comprises side walls 30l which are generally inclined with respect to the axis (Oz). Hole 30 has a tapered shape going from surface 11 of substrate 10 to free surface 14s. Side walls 30l and free surface 14s of layer 14 of first material are joined by a pad 40 made from first material. Pad 40 is salient with respect to free surface 14s which is mainly flat.

The method for producing layer 14 of first material and hole 30 gives rise to formation of pad 40 bordering hole 30. In other words, pad 40 can be considered as a characteristic shape of the formation by spin coating of layer 14 of first material and of hole 30.

Figure 5A:
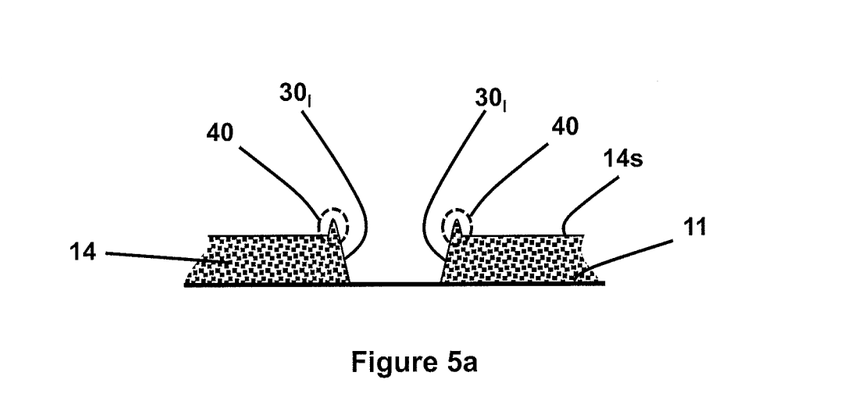
FIGS. 5a and 5b illustrate, in schematic manner in cross-section, steps for producing salient pads on a substrate from a patterned layer of FIG. 3c.
Figure 5B:
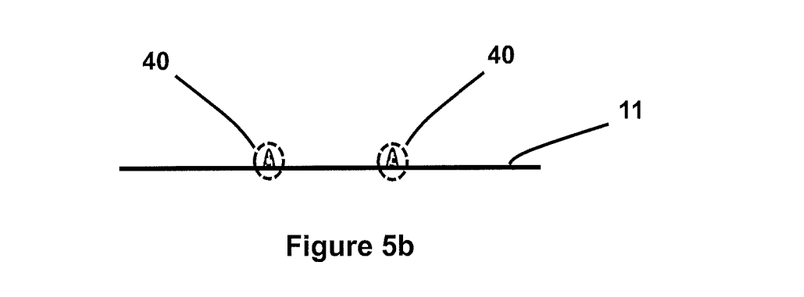

According to a particular embodiment illustrated in FIGS. 5a and 5b, the method also comprises an etching step. After formation of hole 30 and of its pad 40, anisotropic etching of the first material is performed to form a continuous closed pattern representative of the periphery of hole 30.

The etching step can be configured to etch the first material of patterned layer 14 over its whole thickness. In other words, the etching step is configured to eliminate the first material comprised between free surface 14s and surface 11 of substrate 10, to only leave pad 40 salient from surface 11, i.e. the excess thickness.

Advantageously, deposition and patterning of layer 14 of first material, in association with other microfabrication techniques, can enable complex shapes to be achieved, in particular from polymer resin. For example, this method can be used to form tapered dots, crowns, or spikes. This particular production method does not involve the use of spacers.

The topography of hole 30 further in particular depends:
on the dimensions and material of particle 12;
on the material of resin 13 and on its viscosity; and
on the roughness of surface 11 of substrate 10.

What is meant by topography is in particular the slope of side walls 30l and the dimensions of hole 30 along an axis (Oy) substantially perpendicular to the axis (Oz). Hole 30 generally has the form of a well, and its dimensions along the axis (Oy) therefore generally correspond to the diameters of the openings of the well at the level of surface 11 and at the level of free surface 14s.

In the case where resin 13 and substrate 10 are fixed, the topography of hole 30 can be adjusted by choosing a suitable type of particles to obtain for example the required well diameter.

For example, in a first step the material of particle 12 will be chosen according to resin 13. Depending on the affinity of particle 12 with respect to resin 13, hole 30 will be more less wide. In other words, a particle formed by a material presenting a large repulsion with respect to resin 13 will generate a wider hole 30 than if a particle 12 having a better affinity with respect to resin 13 was used.

After the choice of material, the dimensions of particle 12 can be optimized to form a hole 30 having substantially the required dimensions. This optimization can be achieved by performing a test deposition. For spherical particles 12, several particles 12 having different diameters can for example be arranged, and the particle then be chosen having the optimum diameter which substantially enables hole 30 with the required dimensions to be obtained. Furthermore, in the centrifugation speed range usually used in the micro-electronics field, no dependence was observed between the topography of hole 30 and the spin coating speed, enabling a uniform layer 14 of first material to be produced.

In general manner, for each new particle 12/resin 13 pair considered, it is preferable to perform calibration of hole 30 formed according to the dimensions of particle 12.

The width of hole 30 formed by the spin coating deposition can further also be adjusted by optimizing the temperature of resin 13 just before the latter is deposited on substrate 10. Optimizing the temperature of resin 13 does in fact result in optimization of its viscosity, which has a direct impact on the dewetting phenomenon of the resin around particle 12. Therefore, to produce a narrower hole 30 with the same resin and the same particles, the temperature of the resin can for example be lowered before deposition to increase its viscosity. In the same way, to produce a wider hole 30 with the same resin and the same particles, the temperature of the resin can for example be increased before deposition to lower its viscosity.

The method according to the invention enables a hole 30 to be formed in advantageous manner having a dimension, along an axis (Oy) substantially parallel to surface 11 of substrate 10, that is 2 to 20 times larger than the dimension of particle 12 along the axis (Oy), for example the diameter of a spherical particle 12.

According to an embodiment that is compatible with those described in the foregoing, patterned layer 14 made from first material is cross-linked after the spin coating deposition and patterning step. Resin 13 generally being deposited in a liquid state, the cross-linking step is advantageously performed to improve the strength of first material layer 14 formed and patterned by spin coating. Cross-linking of the patterned layer can be achieved by any known means compatible with the resin. For example, cross-linking can be performed by light irradiation and/or by thermal annealing.

According to another particular embodiment, patterned layer 14 of first material undergoes a heat treatment step. Patterned layer 14 of first material preferably undergoes a heat treatment step before being cross-linked by light irradiation. Layer 14 can further undergo heat treatment before, during or after cross-linking of the polymer to improve its structural and mechanical properties.

The heat treatment step of layer 14 before cross-linking of the latter advantageously enables the dimensions of hole 30 formed and the shape of the latter to be finely adjusted. The heat treatment enables a soft redistribution of the first material of layer 14 around hole 30, which can result in an enlargement of the hole and/or a change of slope of side walls 30l and of the height of pad 40.

According to a second example embodiment, polyepoxide layer 14 underwent heat treatment before cross-linking. This heat treatment was performed at a temperature of about 60° C. for 10 minutes. The other fabrication steps are identical to those of the first example described above. This additional heat treatment step enabled holes 30 having a width of about 20 µm and pads with a height of about 2 µm to be formed.

Figure 6:
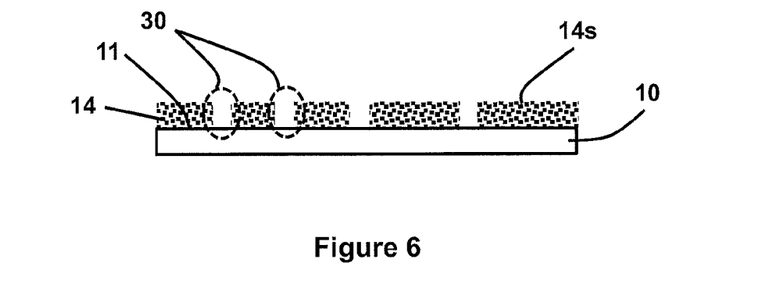
FIG. 6 illustrates, in schematic manner in cross-section, a patterned layer according to another embodiment.

According to a particular embodiment illustrated in FIG. 6, particle 12 is eliminated from surface 11 of substrate 10, after formation and patterning of layer 14 of first material. Particle 12 is only used to generate the dewetting phenomenon and to form hole 30 in layer 14 of first material.

This embodiment advantageously enables holes to be formed which comprise smooth sidewalls having a small roughness, and a bottom formed by a portion of surface 11 of substrate 10, i.e. having the same surface roughness as surface 11 of the substrate.

In the field of micro and nanotechnologies, particular attention is paid to problems of contamination of the substrates and of the devices. The elimination step of particle 12 thus advantageously enables contamination of the substrates and of the devices to be prevented during the technological steps that layer 14 may have to undergo.

Elimination of particle 12 on surface 11 of substrate 10 depends in particular on its material, its geometric shape and its dimensions. For example, surface rinsing/cleaning/treatment techniques of the substrates, or even chemical or physical etching techniques of the particles, can be used. All these techniques are commonly used in the microelectronics field.

According to the example embodiment described above, microparticles 12 of ZnO are eliminated by rinsing with deionized water followed by ultrasonic cleaning in an alcohol solution and finally blowing/drying by means of a compressed air blower.

Furthermore, in the field of encapsulation of electronic components, in particular microbatteries, a layer of polymer material arranged on the component is generally used. The polymer layer both limits the defects linked to the roughness of the substrate on which the component has been made, and enables the thermomechanical deformations of the component to be accommodated when the component is used.

However, such a polymer layer does not constitute an efficient barrier against moisture and oxygen, which can be detrimental to the operating efficiency of the component in time. The polymer layer is thus advantageously provided with an overlying additional metallic layer forming a protective barrier against oxygen and moisture.

The arrangement of such a metallic layer can be performed in such a way as to accidentally come into contact with the contact connection of the component, thereby generating a short-circuit detrimental to operation of the component.

A requirement exists to provide an electronic component provided with a polymer encapsulation layer that is easy to produce and efficient while at the same time avoiding the shortcomings set out above.

This requirement tends to be met by providing an electronic component comprising a polymer encapsulation layer provided with a lateral separation so as to electrically insulate the contact connection of the component and a metallic encapsulation layer.

Figure 7A:
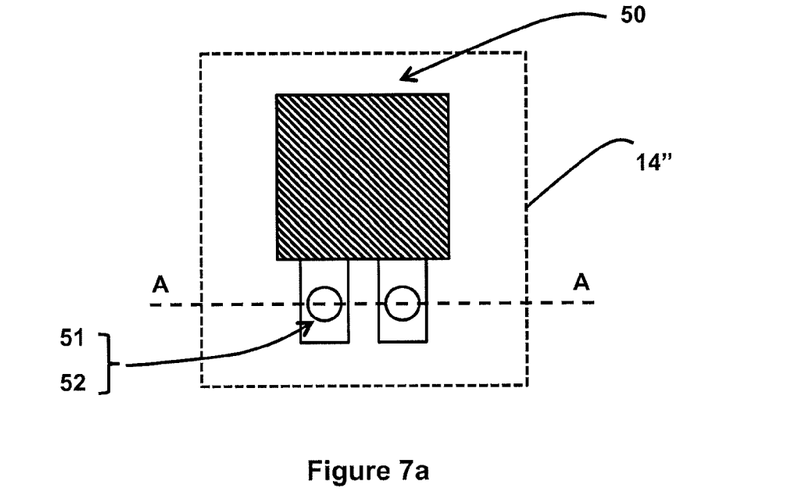
FIG. 7a illustrates, in schematic manner in top view, an electronic device according to an embodiment.
Figure 7B:
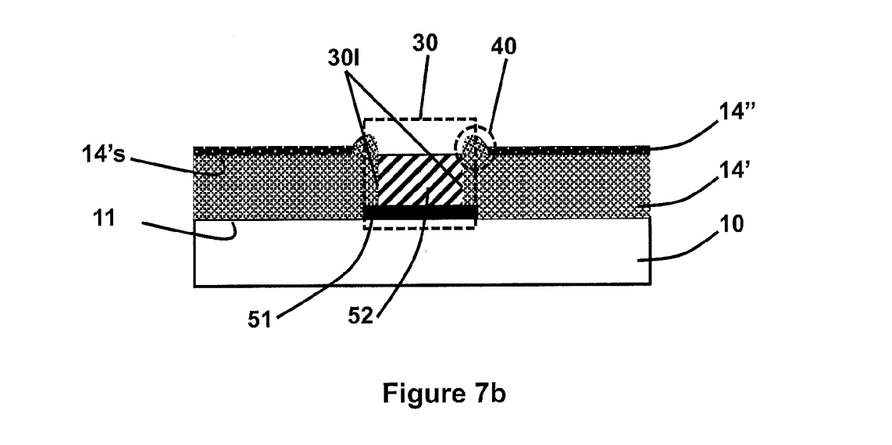
FIG. 7b illustrates, in schematic manner, a cross-section of FIG. 7a along the line AA.

According to a particular embodiment illustrated in FIGS. 7a and 7b, an electronic component 50 is arranged on a surface 11 of a substrate 10. What is meant by electronic component is a device electrically connected with an electric power generation source or another device providing it with electric power. Component 50 is preferably a microelectronic device, a MEMS device or a microbattery, made from a substrate 10 formed by semiconductor material.

Component 50 comprises at least a first electric contact pad 51. Pad 51 enables a contact connection to be made with an electric connection so as to electrically connect component 50 with another device. For example purposes, pad 51 can be made from metallic material made on substrate 10 by any known means.

Component 50 further comprises a first encapsulation layer 14' made from electrically insulating polymer material arranged on surface 11 of substrate 10. Layer 14' comprises a surface 14's opposite surface 11, and is preferably made from epoxy. First layer 14' is further formed in such a way as to comprise a pass-through hole 30 opening onto pad 51. Layer 14' is preferably deposited by spin coating by means of the fabrication method described in the foregoing.

A particle can thus be arranged on pad 51, using for example the technique called the soft lithography technique. A patterned pad impregnated with a solvent containing the particle can be pressed against surface 11 of substrate 10 to deposit the particle at a precise location, in other words on pad 51. The solvent is then evaporated to only leave said particle. Deposition of the polymer material resin is then performed by spin coating so as to form pass-through hole 30. Pass-through hole 30 further comprises side walls 30l connected to surface 14's by a pad 40 made from electrically insulating polymer material.

Component 50 also comprises a second pad 52 made from electrically conducting material. Second pad 52 is arranged on first pad 51 and is located in hole 30. Second pad 52 is preferably made from metallic material, for example from silver.

To form a protection barrier against oxygen and moisture, a second electrically conducting encapsulation layer 14" is arranged on surface 14's. Second layer 14" is arranged in such a way that first and second encapsulation layers 14' and 14" form a bilayer totally covering component 50 with the exception of second pad 52.

First and second layers 14' and 14" are further formed in such a way that pad 40 laterally separates second pad 52 and second encapsulation layer 14".

Component 50 thus advantageously comprises an efficient lateral electric insulation that is easy to achieve between its contact connection (pad 52) and the metallic encapsulation layer.

Advantageously, second pad 52 completely covers side walls 30l of hole 30, leaving only pad 40 uncovered. This arrangement thus also enables side walls 30l of hole 30 made from polymer material to be protected by a metal layer. The tightness and efficiency of protection of the first and second encapsulation layers against oxygen and moisture is thus enhanced.

Figure 8A:
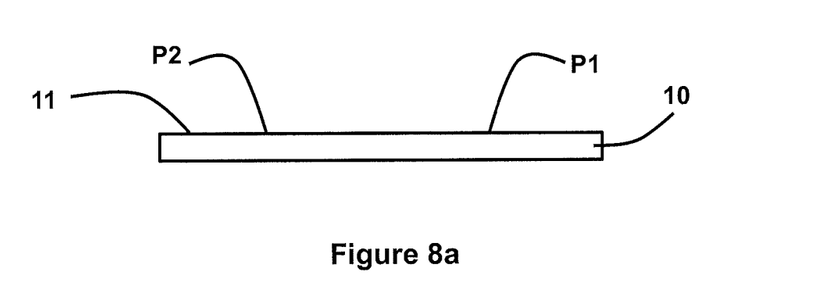
FIGS. 8a to 8c illustrate, in schematic manner in cross-section, steps for producing a patterned layer on a substrate by spin coating according to another embodiment.
Figure 8B:
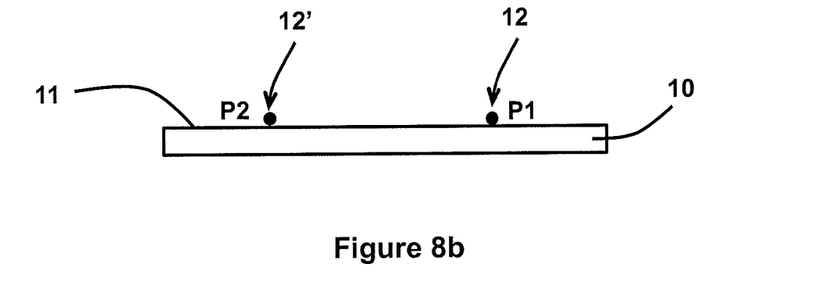
Figure 8C:
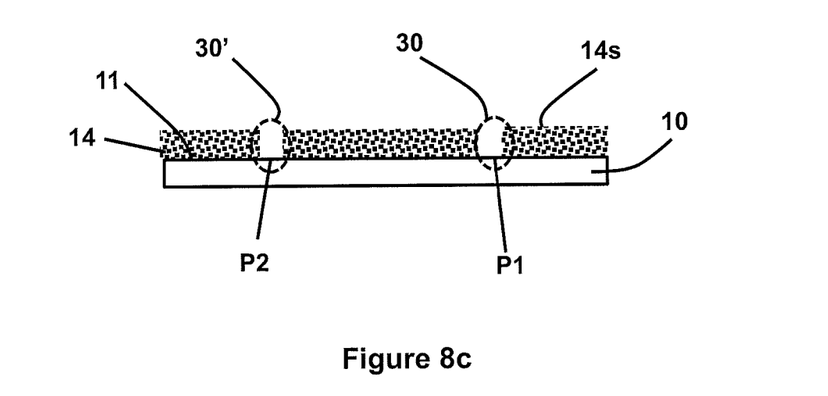

According to an advantageous embodiment of patterned layer 14, at least two particles are arranged on the substrate. As illustrated in FIGS. 8a to 8c, at least one additional particle 12' is arranged on surface 11 of substrate 10 so that particle 12 and additional particle 12' are located at first P1 and second P2 predefined positions of surface 11 of substrate 10. Furthermore, the material of additional particle 12' is chosen such that additional particle 12' also exerts a repulsive interaction with respect to resin 13. The arrangement of particles 12 and 12' on the surface 11 of substrate 10, in addition to layer 14 of first material and hole 30, enables an additional hole 30' to be formed passing through layer 14 and opening onto additional particle 12'.

This embodiment advantageously enables the layer of first material and the holes to be formed at precise locations using the same spin coating deposition step.

To locate particles 12 and 12' at predefined locations of surface 11 of substrate 10, several techniques can be used.

The technique called soft lithography technique can be used. For example, a patterned pad impregnated with a solvent containing particles 12 and 12' can be pressed against surface 11 of substrate 10 to deposit particles 12 and 12' at precise locations. The solvent is then evaporated to leave only particles 12 and 12'.

Furthermore, particles 12 and 12' can be deposited by means of an AFM probe by diffusion through a water meniscus or by PVD (PVD standing for Physical Vapour Deposition), CVD (CVD standing for Chemical Vapour Deposition), electro-deposition etc. Particles 12 and 12' can in fact be deposited in the form of ultra-thin layers and then eliminated locally at the places where they are undesirable by photolithography.

After particles 12 and 12' have been arranged, the other steps, in particular the spin coating deposition step, are identical to the different steps of the other embodiments described above.

According to another embodiment, first P1 and second P2 predefined positions are chosen such that pass-through hole 30 and additional pass-through hole 30' overlap. This particular arrangement of particles 12 and 12' advantageously enables more or less complicated patterns to be achieved in layer 14 of first material. For example, by means of this inventive method, trenches can easily be made in layer 14. The method thus makes it possible to achieve trenches having an identical surface state to that substrate 10, in other words keeping the roughness.

The invention claimed is:

1. A method for producing a patterned layer made from first material on a surface of a substrate comprising the following successive steps:
arranging a particle on the surface of the substrate;
depositing a resin by spin coating on the surface of the substrate so as to form the patterned layer of first material and a hole passing through the layer of first material and opening onto the particle;

the material of the particle and the resin being chosen such that the particle exerts a repulsive interaction with respect to the resin.

2. The method according to claim 1, wherein the patterned layer of first material is cross-linked after the spin coating deposition step.

3. The method according to claim 1, wherein the patterned layer of first material undergoes a heat treatment step.

4. The method according to claim 1, comprising an elimination of the particle after formation of the patterned layer of first material.

5. The method according to claim 1, wherein the thickness of the patterned layer is greater than the dimension of the particle along an axis substantially perpendicular to the surface of the substrate.

6. The method according to claim 1, comprising an arrangement of at least one additional particle on the surface of the substrate so that the particle and the additional particle are located at first and second predefined positions of the surface of the substrate, and in that the material of the additional particle is chosen such that the additional particle exerts a repulsive interaction with respect to the resin so as to form an additional hole passing through the layer of first material and opening onto the additional particle.

7. The method according to claim 6, wherein the first and second predefined positions are chosen such that the pass-through hole and the additional pass-through hole overlap.

8. The method according to claim 1, wherein the pass-through hole (30) comprises side walls and that the patterned layer of first material comprises a free surface opposite the surface of the substrate, the side walls and the free surface are connected by a pad made from first material, the method comprising anisotropic etching of the first material to form a continuous closed pattern representative of the periphery of the hole.

* * * * *